United States Patent
Xiao

(10) Patent No.: US 10,056,573 B2
(45) Date of Patent: Aug. 21, 2018

(54) ORGANIC LIGHT-EMITTING DIODE DISPLAY PANEL, MANUFACTURING METHOD THEREOF AND DISPLAY

(71) Applicants: BOE TECHNOLOGY GROUP CO., LTD., Beijing (CN); ORDOS YUANSHENG OPTOELECTRONICS CO., LTD., Ordos (CN)

(72) Inventor: Ang Xiao, Beijing (CN)

(73) Assignees: BOE TECHNOLOGY GROUP CO., LTD., Beijing (CN); ORDOS YUANSHENG OPTOELECTRONICS CO., LTD., Ordos (CN)

(*) Notice: Subject to any disclaimer, the term of this patent is extended or adjusted under 35 U.S.C. 154(b) by 0 days.

(21) Appl. No.: 15/094,342

(22) Filed: Apr. 8, 2016

(65) Prior Publication Data

US 2016/0329518 A1    Nov. 10, 2016

(30) Foreign Application Priority Data

May 8, 2015 (CN) .......................... 2015 1 0233854

(51) Int. Cl.
*H01L 51/52* (2006.01)
*H01L 51/56* (2006.01)

(52) U.S. Cl.
CPC ........ *H01L 51/5243* (2013.01); *H01L 51/525* (2013.01); *H01L 51/5271* (2013.01); *H01L 51/56* (2013.01)

(58) Field of Classification Search
CPC ............... H01L 51/529; H01L 27/3276; H01L 27/3262; H01L 51/5246

(Continued)

(56) References Cited

U.S. PATENT DOCUMENTS

2007/0037402 A1* 2/2007 Inoue ........................ C23F 1/20
  438/758
2008/0128689 A1* 6/2008 Lee ..................... H01L 29/7869
  257/43

(Continued)

FOREIGN PATENT DOCUMENTS

CN        103676339 A       3/2014
CN        103885252 A       6/2014

(Continued)

OTHER PUBLICATIONS

First Office Action regarding Chinese Application No. 201510233854.9, dated Jun. 1, 2017. Translation provided by Dragon Intellectual Property Law Firm.

(Continued)

*Primary Examiner* — Fernando L Toledo
*Assistant Examiner* — Adam S Bowen
(74) *Attorney, Agent, or Firm* — Harness, Dickey & Pierce, P.L.C.

(57) ABSTRACT

The present disclosure provides an organic light-emitting diode (OLED) display panel and a manufacturing method thereof and a display. The OLED display panel includes a glass back plate, a glass cover plate and the frit and multiple metal blocks located between the glass back plate and the glass cover plate. Each metal block is coated with an inorganic protective layer. There is a hole region between two adjacent metal blocks. The frit is in contact with the glass back plate via the hole regions. At least one of the metal blocks has a surface that can reflect incident laser light to the hole regions.

15 Claims, 5 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2015/0021573 A1* | 1/2015 | Kwak | ................. | H01L 27/3253 257/40 |
| 2015/0296573 A1* | 10/2015 | Hsiao | ................. | H01L 51/5246 359/850 |

FOREIGN PATENT DOCUMENTS

| | | |
|---|---|---|
| CN | 104064687 A | 9/2014 |
| CN | 104332484 A | 2/2015 |

OTHER PUBLICATIONS

Third Chinese Office Action regarding corresponding Chinese Application No. 2015102338549 dated Apr. 2, 2018. English translation provided by Dragon Intellectual Property Law Firm.

* cited by examiner

ORGANIC LIGHT-EMITTING DIODE DISPLAY PANEL, MANUFACTURING METHOD THEREOF AND DISPLAY

CROSS-REFERENCE TO RELATED APPLICATION

The present application claims a priority of the Chinese Patent Application No. 201510233854.9 filed on May 8, 2015, which is incorporated herein by reference in its entirety.

TECHNICAL FIELD

The present disclosure relates to the field of display technology, in particular to an organic light-emitting diode display panel, a manufacturing method thereof and a display.

BACKGROUND

Organic light-Emitting Diode (OLED) Display, also called as Organic Electroluminescence Display (OLED) is a display device that itself emits light by using electrical current to drive light-emitting materials. The OLED needs a good sealant to ensure the normal operation of the internal structures for a long time. Frit encapsulation technology is usually adopted in the related art, where a laser sintering process plays an important role in the sealing performance of the frit. However, there are differences among the states of the laser sintered frit, which results in the differences of the stress and mechanical strength therein, thereby affecting the encapsulation performance of the whole frit.

SUMMARY

The present disclosure provides in the embodiments an organic light-emitting diode display panel, a manufacturing method thereof and a display, so as to decrease the temperature differences between the frit in the different regions when it is heated, thereby enabling the laser sintering state in the OLED display panel to be uniform, and improving the encapsulation performance of the whole frit.

The present disclosure provides in some embodiments an organic light-emitting diode (OLED) display panel, including a glass back plate, a glass cover plate, and the frit and multiple metal blocks located between the glass back plate and the glass cover plate. Each metal block is coated with an inorganic protective layer. A hole region is located between two adjacent metal blocks. The above-mentioned frit is in contact with glass back plate via the hole region. At least one of the above-mentioned metal blocks has a reflective surface that can reflect incident laser light to the above-mentioned hole region.

In the OLED display panel provided by the embodiments of the present disclosure, at least one metal block has a reflective surface that can reflect the incident laser light to the hole region, such that the laser light reflected by the metal block is not only received by the frit of the other regions except hole regions so as to heat the frit in other regions, but also received by the frit in the hole region so as to heat the frit in the hole regions. Therefore, the temperature differences between the frit in the hole regions and other regions are decreased when it is heated by the laser light, thereby enabling the laser sintering state in the OLED display panel to be uniform, and improving the encapsulation performance of the whole frit.

Alternatively, an angle between the above-mentioned reflective surface and the glass back plate is less than 90°.

Alternatively, the above-mentioned angle is 30°-45°.

By setting the angle between the reflective surface and the glass back plate to be 30°-45°, it is able to fully reflect the laser light to the hole regions by the metal blocks, and heat the frit in the hole regions, thereby decreasing the temperature differences between the frit in the hole region and other region when it is heated.

Alternatively, two opposite surfaces of any two adjacent metal blocks are reflective surfaces, the angles between the two reflective surfaces and the above-mentioned glass back plate are equal.

Alternatively, the above-mentioned metal blocks are of a wedge or triangle shape.

By designing the reflective surfaces of the two adjacent metal blocks to have the equal angles, it is able for the hole regions formed by the said two metal blocks to receive even heat that is applied by the laser light reflected by the two metal blocks, thereby enabling the laser sintering state in the OLED display panel to be uniform.

Alternatively, the above-mentioned reflective surface is a curved surface.

Alternatively, the above-mentioned inorganic protective layer is made of materials that allow the above-mentioned laser light to pass therethrough.

The present disclosure further provides in some embodiments an OLED display, including any of the above-mentioned OLED display panels.

The present disclosure further provides in some embodiments a method for manufacturing an organic light-emitting diode (OLED) display panel, including: coating a metal layer on a glass back plate, etching multiple hole regions in the metal layer using an etching solution, forming multiple spaced metal blocks by the metal layer, wherein at least one of the metal blocks has a reflective surface that can reflect incident laser light to the hole regions which are located between two adjacent metal blocks, coating an inorganic protective layer onto a surface of each metal block and etching the inorganic protective layer only in contact with the glass back plate in the hole regions, and coating frit onto the inorganic protective layer and filling up the multiple hole regions with the frit.

According to the method for manufacturing the OLED display panel provided by the embodiments of the present disclosure, it is able to achieve that at least one of metal blocks has a reflective surface which can reflect the incident laser light to the hole regions, enabling the incident laser light to be reflected to the hole regions, and to heat the frit in the hole regions. The inorganic protective layer only in contact with glass back plate in the hole regions is etched, such that the laser light reflected by the metal blocks is not only received by the frit in other regions except the hole regions so as to heat the frit in other regions, but also received by the frit in the hole regions so as to heat the frit in the hole regions. Therefore, the temperature differences between the frit in the hole regions and other regions are decreased when it is heated from the laser light, thereby enabling the laser sintering state in the OLED display panel to be uniform, and improving the encapsulation performance of the whole frit.

Alternatively, an angle between the above-mentioned reflective surface and the glass back plate is less than 90°.

Alternatively, the angle is 30°-45°.

The metal block has a reflective surface that is able to reflect the incident laser light to the hole regions and the angle between the said reflective surface and glass back plate is set as 30°-45°, so that the laser light is fully reflected by the metal blocks to the hole regions, and heats the frit in the hole regions, thereby decreasing the temperature differences between the frit in the hole regions and other regions when it is heated.

Alternatively, two opposite surfaces of any two adjacent metal blocks are reflective surfaces, and the angle between each of the two reflective surfaces and the glass back plate is equal.

The reflective surfaces of the two adjacent metal blocks are designed to have the equal angles, thereby enabling the hole regions formed by the said two metal blocks to receive the laser light reflected by the two metal blocks, then enabling the frit to be heated evenly, and enabling the laser sintering state in the OLED display panel to be uniform.

Alternatively, the reflective surface is a curved surface.

Alternatively, the etching solution is a mixture of phosphoric acid, acetic acid, nitric acid and additives.

Alternatively, percentages by mass of the phosphoric acid, acetic acid, nitric acid and additives are 65~70: 10~15: 2~5: 15~20.

DETAILED DESCRIPTION

The technical solutions of the embodiments of the present disclosure will be described clearly and completely in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent an order, number or importance. Similarly, such words as "one of" or "one" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the OLED display panel in the related art, a big block of metal is deposited under the applying regions of the frit and holes are drilled in the big block of metal. The holes are drilled to ensure the frit to be in direct contact with glass back plate during the process of laser sintering, thereby having a fixation effect.

Figure 1:
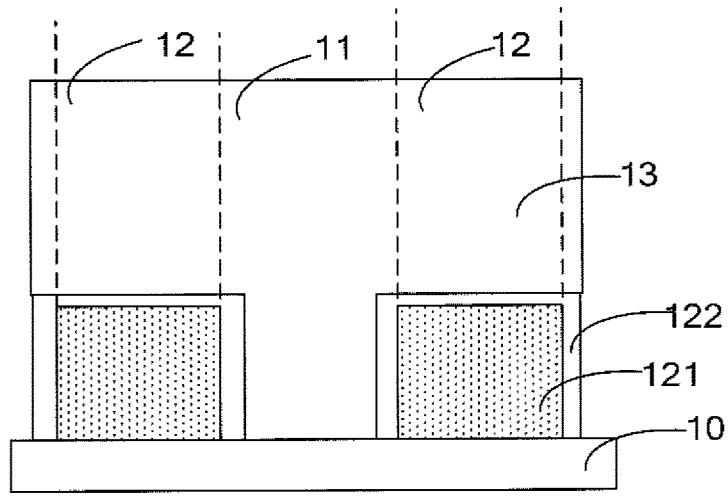
FIG. 1 is a schematic view showing a structure of an OLED display panel.

In an OLED display panel as shown in FIG. 1, there are a hole region 11 and a metal region 12 on the glass back plate 10. The frit 13 is deposited in both the hole region 11 and the metal region 12. A metal block 121 is also provided in the metal region 12, and an inorganic protective layer 122 are provided on the surface of the metal block 121.

However, in this structure, the frit 13 at the bottom of the hole region 11 cannot be irradiated by the laser light reflected by the metal blocks 121 arranged at the two sides, and the inorganic protective layer 122 coated on the metal blocks 121; while the frit 13 in the metal regions 12 can be irradiated by the laser light reflected by the metal blocks 121 at the bottom of the metal regions 12, thus the temperature of the frit in the hole regions is a little lower than those in other regions. The specific schematic views of the optical path of the laser light during the process of laser sintering may refer to FIG. 4. Therefore, there is a difference between the states of laser sintered frit in the hole region 11 and in the metal region 12, which results in the difference of the stress and the mechanical strength, and affects the encapsulation performance of the whole frit.

Embodiments according to the present disclosure provide an Organic Light-Emitting Diode (OLED) display panel, a manufacturing method thereof and display, so as to decrease the temperature differences between the frit in the hole regions and other regions, thereby enabling the laser sintering state in the OLED display panel to be uniform, and improving the encapsulation performance of the whole frit.

Figure 2:
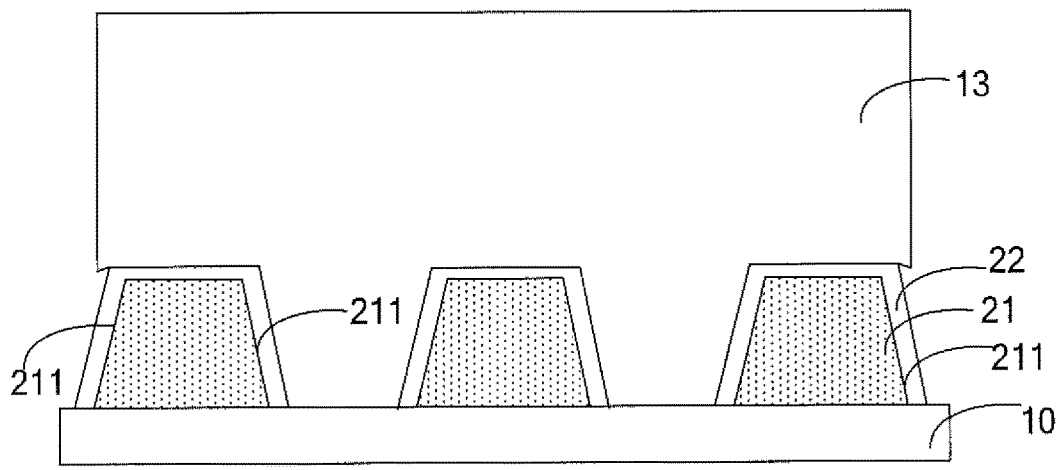
FIGS. 2 and 3 are schematic views showing a structure of an OLED display panel according to an embodiment of the present disclosure.
Figure 3:
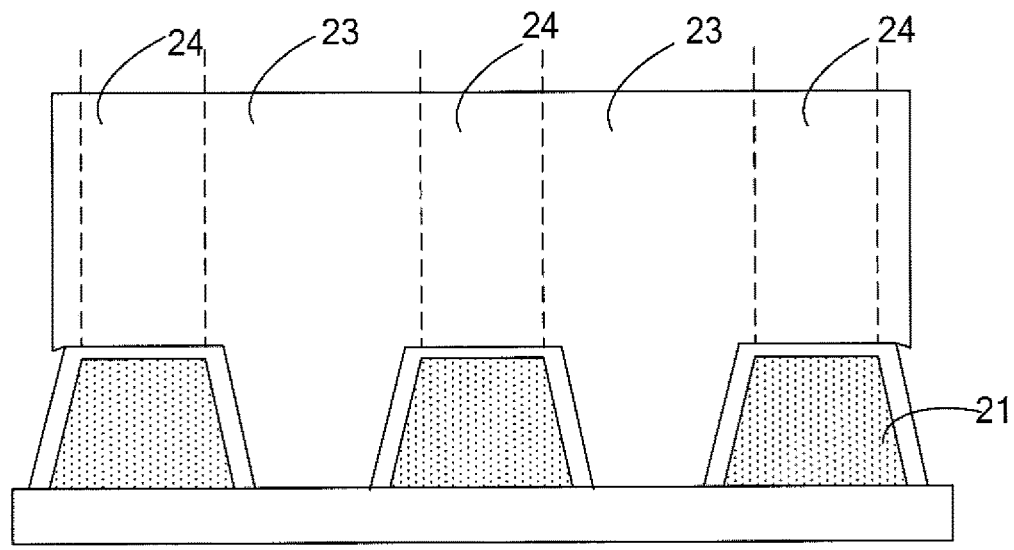
Figure 11:
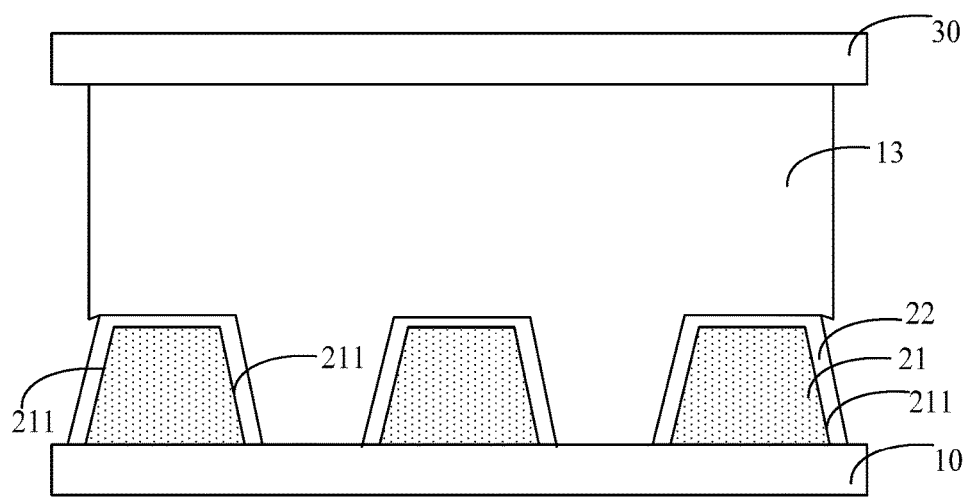
FIG. 11 is a schematic view showing the structure of an OLED display panel according to the embodiments of the present disclosure.

Referring to FIGS. 2 and 11, the present disclosure provides in an embodiment an Organic Light-Emitting Diode (OLED) display panel, comprising a glass back plate 10, a glass cover plate (located on the uppermost layer, for example as shown by 30 of FIG. 11), and the frit 13 and multiple metal blocks 21 located between the glass back plate and the glass cover plate. Each metal block 21 is coated with an inorganic protective layer 22, and a hole region, which is not shown in FIG. 2, but may refer to 23 in FIG. 3, is located between two adjacent metal blocks. The frit is in contact with the glass back plate 10 through hole regions. At least one metal block 21 and the inorganic protective layer 22 coated thereon have a reflective surface 211 which can reflect an incident laser light to the hole regions.

Figure 4:
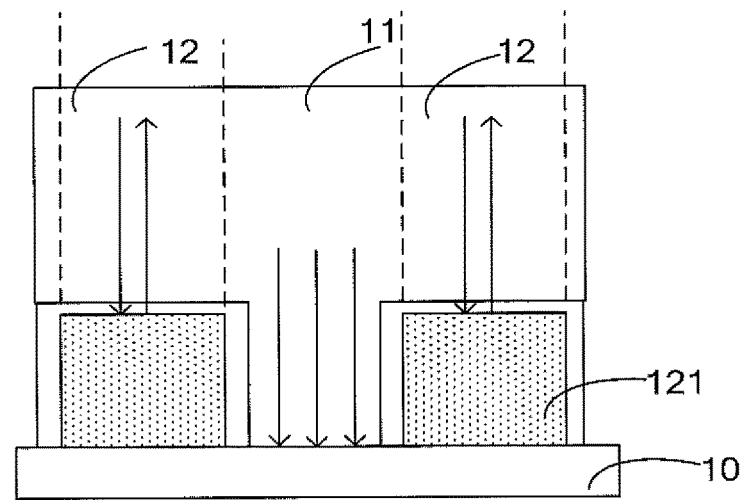
FIG. 4 is a schematic view of the laser optical path during the process of laser sintering in the OLED display panel of FIG. 1.
Figure 5:
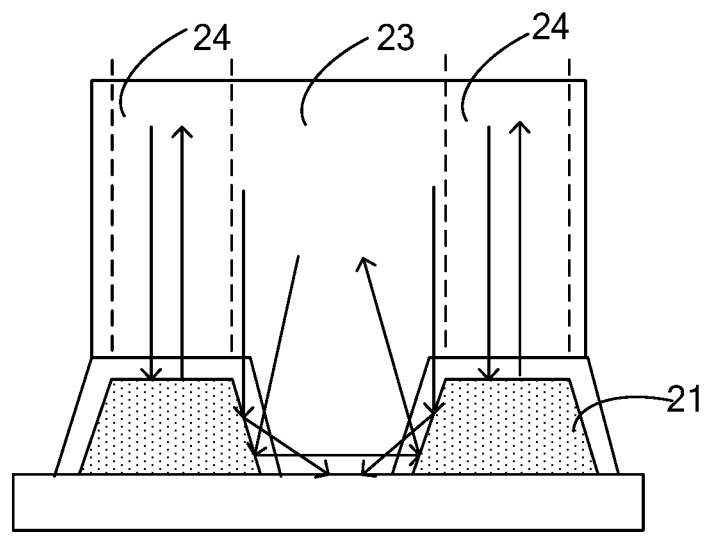
FIG. 5 is a schematic view of the laser optical path during the process of laser sintering in the OLED display panel according to an embodiment of the present disclosure.

Referring to FIG. 3, in the embodiments of the present disclosure, the regions coated with the frit 13 can be divided into two regions, a hole region 23 and a metal region 24. The hole region 23 includes the region between two adjacent metal blocks 21 and the upright region located vertically upward on the said region, while the metal region 24 is the region between two adjacent hole regions. When the laser light irradiates vertically, there is vertically reflected light in the metal region 24. The difference from the OLED display panel as shown in FIG. 1 is that there also exists the reflected laser light in the hole region 23, due to the reflective surface on the metal block 21 in the embodiments of the present disclosure, To be specific, FIG. 4 is a schematic view of the optical path of the laser light during the process of the laser sintering in the OLED display panel as shown in FIG. 1. As shown in FIG. 4, due to the metal block 121 in the metal region 12, the frit in the metal region can receive the laser light reflected by the metal block; while in the hole region 11, since there is no metal block 121, the frit inside the hole region 11 and the glass back plate 10 at the bottom can't receive the laser light reflected by the metal blocks on two sides. FIG. 5 is a schematic view of the optical path of the laser light during the process of laser sintering in the OLED display panel provided by the embodiments of the present disclosure. As shown in FIG. 5, the metal region 24 can receive the laser light reflected by the metal block 21; while since there is a reflective surface 211 on the metal block 21 in the hole region 23, the frit in the hole region 23 can also receive the reflective laser light reflected by the metal blocks on the two side, and the glass back plate 10 at the bottom can also receive the laser light reflected by the metal blocks.

In the OLED display panel provided by the embodiments of the present disclosure, at least one of metal blocks and the inorganic protective layer coated thereon have a reflective surface which can reflect the incident laser to a hole region, so that the laser light reflected by the metal blocks is not only received by the frit in the metal regions except the hole regions, so as to heat the frit in metal regions, but also received by the frit in the hole regions so as to heat the frit in the hole regions. Therefore, the temperature differences between the frit between the hole regions and other regions can be decreased when it is heated, thereby enabling laser sintered frit to have a uniform state in the OLED display panel, and improving the encapsulation performance of the whole frit.

It should be noted that, a reflective surface 211 of the metal block provided by the embodiments of the present disclosure is coated with an inorganic protective layer 22, the laser light can be fully transmitted but not reflected by the said inorganic protective layer. That is, the inorganic protective layer 22 is transparent to the said laser light.

Alternatively, the angle between the said reflective surface 211 and the glass back plate 10 is less than 90°.

Figure 6:
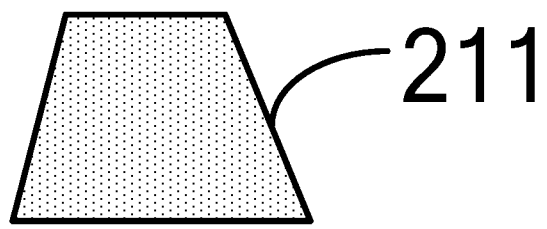
FIGS. 6-10 are schematic views showing some shapes of the metal blocks according to the embodiments of the present disclosure.
Figure 7:
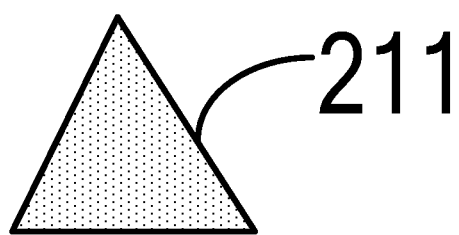

For example, referring to FIG. 6, the metal block 21 may be of a wedge shape, or referring to FIG. 7, the metal block 21 may be of a triangle shape. Of course, when the metal block is of the shape as shown in FIG. 7, the region formed by two adjacent metal blocks is a hole region, so the entire frit regions are all hole regions in the OLED display panel made of the metal blocks as shown in FIG. 7, and there is no metal region. When implementing laser sintering, the frit are all heated by the laser light reflected by the reflective surfaces of the metal blocks, thereby enabling laser sintered frit to have a uniform state in the OLED display panel, and improving the encapsulation performance of the whole frit.

Alternatively, the angle between the said reflective surfaces 211 and the glass back plate is 30°-45°.

By setting the angle between the said reflective surface and the glass back plate to be 30°-45°, it is able to fully reflect the laser light to the hole region by the metal blocks so as to heat the frit in the hole region, thereby decreasing the temperature differences between the frit between the hole regions and other regions when heating the frit.

Alternatively, the opposite surfaces of each two adjacent metal blocks are both reflective surfaces 211, and the angles between each of reflective surfaces 211 and the glass back plate 10 are identical.

By designing the reflective surfaces of the two adjacent metal blocks to have the identical angle, it is able to evenly heat the hole regions formed by the said two metal blocks by the laser light reflected by the two metal blocks, thereby enabling the laser sintering state in the OLED display panel to be uniform, and improving the encapsulation performance of the whole frit.

It should be noted that, the angles between the opposite reflective surfaces of two adjacent metal blocks and the glass back plate may not be equal. It will be fine as long as the angle between the reflective surface 211 and the glass back plate is less than 90°.

Alternatively, the said reflective surface 211 is a curved surface.

Figure 8:
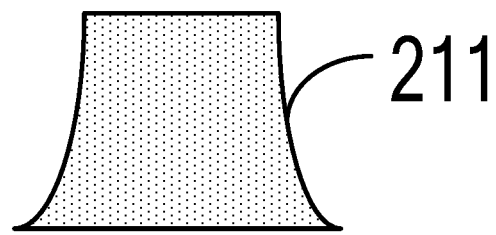
Figure 9:
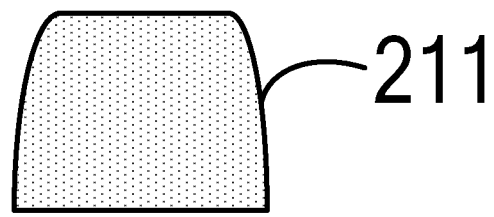
Figure 10:
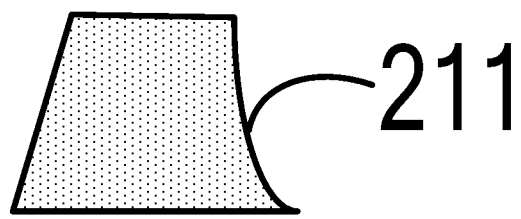

Referring to FIGS. 8 and 9, the reflective surface 211 of the metal block may be a curved surface that reflects incident laser light to a hole region. Referring to FIG. 8, the reflective surface 211 is concave, and referring to FIG. 9, the reflective surface is convex. Of course, the shapes of the reflective surface 211 are not limited to the curved surfaces as shown in FIGS. 8 and 9. For example, referring to FIG. 10, with respect to the two reflective surfaces 211 of each metal block, one of them may be a curved surface, and the other may be not a curved surface. Of course, the shapes of the reflective surface 211 are also not limited to the shapes as shown in FIG. 10.

It should be noted that, no matter of what shape the reflective surface 211 of the metal block 21 in the embodiments of the present disclosure is, as long as it is able to reflect the incident laser to the hole regions, it will falls within the scope of the present disclosure.

Herein, the materials of the metal blocks may be Mo or other materials.

Embodiments according to the present disclosure further provide an OLED display, including any of the OLED display panel provided by the embodiments of the present disclosure.

The embodiments according to the present disclosure further provide a manufacturing method of an Organic Light-Emitting Diode (OLED) display panel, including the follow steps.

The glass back plate is coated with the metal layer.

Multiple hole regions are etched on the metal layer using an etching solution, so as to making the metal layer to form multiple spaced metal blocks. Furthermore, at least one of the metal blocks has a reflective surface which can reflect the incident laser light to the hole regions, wherein the region between two adjacent metal blocks is a hole region;

An inorganic protective layer is coated on the surface of each metal block and a portion of the inorganic protective layer which is only in contact with a glass back plate in the hole regions is etched.

The frit is coated on the inorganic protective layer and fills up the multiple hole regions.

According to the manufacturing method of the OLED display panel provided by the embodiments of the present disclosure, it is able to achieve that at least one of metal blocks and the inorganic protective layer coated thereon have a reflective surface which can reflect an incident laser light to the hole regions, enabling the incident laser light to be reflected to the hole regions, and to heat the frit in the hole regions. The portion of the inorganic protective layer only in contact with the glass back plate in the hole regions is etched, such that the laser light reflected by the metal blocks is not only received by the frit in other regions except hole regions so as to heat the frit in other regions, but also received by the frit in the hole regions so as to heat the frit in the hole regions. Therefore, the temperature differences between the frit in the hole regions and other regions is decreased when the heat by the laser light is applied, thereby enabling the laser sintering state in the OLED display panel to be uniform, and improving the encapsulation performance of the whole frit.

Alternatively, the angle between the reflective surface and the glass back plate is less than 90°.

Alternatively, the angle is 30°-45°.

By setting the angle between the said reflective surface and glass back plate to be 30°-45°, it is able to fully reflect laser light to the hole regions by the metal blocks, and heat the frit in the hole regions, thereby decreasing the temperature differences between the frit in the hole regions and other regions when the it is heated.

Alternatively, the opposite surfaces of each two adjacent metal blocks are both reflective surfaces, and the angles between each of reflective surfaces and the glass back plate are equal.

By designing the reflective surfaces of the two adjacent metal blocks to have the equal angles, it is able to evenly heat the hole regions formed by the said two metal blocks by the laser light reflected by the two metal blocks, thereby enabling the laser sintering state in the OLED display panel to be uniform.

Alternatively, the reflective surface is a curved surface.

Alternatively, the etching solution is a mixture of phosphoric acid, acetic acid, nitric acid and additives. The additives are used as the solvents which adjust the pH value of the mixture, for example, water ($H_2O$) etc.

To be specific, percentages by mass of the phosphoric acid, acetic acid, nitric acid and additives are 65~70: 10~15: 2~5: 15~2.

The etching solutions according to the embodiments of the present disclosure can be better used to form the shape of the metal block provided by the embodiments of the present disclosure.

In summary, the present disclosure further provides in an embodiment an Organic Light-Emitting Diode (OLED) display panel, including a glass back plate, a glass cover plate, frit and multiple metal blocks located between the glass back plate and the glass cover plate. Each metal block is coated with an inorganic protective layer. There is a hole region between two adjacent metal blocks, and the frit is in contact with the glass back plate via hole regions. At least one metal block and the inorganic protective layer coated thereon have a surface that can reflect incident laser light to a hole region. As a result, the temperature differences between the frit between the hole regions and other regions when it is heated is decreased, the laser sintering state of the frit in the OLED display panel is uniform, and the encapsulation performance of the whole frit is improved.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. An Organic Light-Emitting Diode (OLED) display panel, comprising:
    a glass back plate,
    a glass cover plate, and
    frit and multiple metal blocks, located between the glass back plate and the glass cover plate,
    wherein each metal block is coated with an inorganic protective layer, a hole region is located between two adjacent metal blocks, the frit is in contact with the glass back plate via the hole region, at least one of the metal blocks has a reflective surface that can reflect incident laser light to the hole region, and
    wherein an angle between the reflective surface and the glass back plate is 30° to 45°.

2. The OLED display panel according to claim 1, wherein two opposite surfaces of any two adjacent metal blocks are reflective surfaces, the angles between the two reflective surfaces and the glass back plate are equal.

3. The OLED display panel according to claim 1, wherein the metal blocks are of a wedge or triangle shape.

4. The OLED display panel according to claim 1, wherein the reflective surface is a curved surface.

5. The OLED display panel according to claim 1, wherein the inorganic protective layer is made of materials that allow the laser light to pass therethrough.

6. An OLED display, comprising the OLED display panel according to claim 1.

7. The OLED display according to claim 6, wherein two opposite surfaces of any two adjacent metal blocks are reflective surfaces, and the angle between each of the two reflective surfaces and the glass back plate is equal.

8. The OLED display according to claim 6, wherein the metal blocks are of a wedge or triangle shape.

9. The OLED display according to claim 6, wherein the reflective surface is a curved surface.

10. The OLED display according to claim 6, wherein the inorganic protective layer is made of materials that allow the laser light to pass therethrough.

11. A method for manufacturing an organic light-emitting diode (OLED) display panel, comprising:
    coating a metal layer on a glass back plate,
    etching multiple hole regions in the metal layer using an etching solution,
    forming multiple spaced metal blocks by the metal layer, wherein at least one of the metal blocks has a reflective surface that can reflect incident laser light to the hole regions which are located between two adjacent metal blocks,
    coating an inorganic protective layer onto a surface of each metal block and etching the inorganic protective layer only in contact with the glass back plate in the hole regions, and
    coating frit onto the inorganic protective layer and filling up the multiple hole regions with the frit,
    wherein an angle between the reflective surface and the glass back plate is 30°-45°.

12. The method according to claim 11, wherein two opposite surfaces of any two adjacent metal blocks are reflective surfaces, and the angle between each of the two reflective surfaces and the glass back plate is equal.

13. The method according to claim 11, wherein the reflective surface is a curved surface.

14. The method according to claim 11, wherein the etching solution is a mixture of phosphoric acid, acetic acid, nitric acid and additives.

15. The method according to claim 14, wherein percentages by mass of the phosphoric acid, acetic acid, nitric acid and additives are: 65~70: 10~15: 2~5: 15~20.

* * * * *